United States Patent
Krueger

(10) Patent No.: US 6,852,984 B2
(45) Date of Patent: Feb. 8, 2005

(54) ADVANCED ION BEAM MEASUREMENT TOOL FOR AN ION IMPLANTATION APPARATUS

(75) Inventor: Christian Krueger, Liegau-Augustusbad (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/784,510

(22) Filed: Feb. 23, 2004

(65) Prior Publication Data

US 2004/0262532 A1 Dec. 30, 2004

(30) Foreign Application Priority Data

Jun. 30, 2003 (DE) .......................................... 103 29 388

(51) Int. Cl.[7] .............................................. H01J 37/317
(52) U.S. Cl. .................. 250/397; 250/398; 250/396 R; 250/492.21; 250/492.2
(58) Field of Search ............................. 250/397, 396 R, 250/398, 492.1, 492.2

(56) References Cited

U.S. PATENT DOCUMENTS 5,903,002 A * 5/1999 Turner et al. ............... 250/397
6,437,351 B1 * 8/2002 Smick et al. ................ 250/398
6,525,327 B1 * 2/2003 Mitchell et al. ............. 250/398
6,768,118 B2 * 7/2004 Nakayama et al. .......... 250/397
6,791,094 B1 * 9/2004 Olson et al. ................. 250/397

FOREIGN PATENT DOCUMENTS

| DE | 10050200 A1 | 5/2001 | .......... H01J/37/147 |
| WO | WO 00/20851 | 4/2000 | .......... G01N/27/00 |
| WO | WO 01/51183 A1 | 7/2001 | .......... B01D/59/44 |

* cited by examiner

Primary Examiner—Nikita Wells
Assistant Examiner—Johnnie L. Smith, II
(74) Attorney, Agent, or Firm—Williams, Morgan & Amerson, P.C.

(57) ABSTRACT

An array of high aspect openings enables fast and accurate measurement of incidence angle deviation and/or beam divergence. The high aspect ratio assures that only ions of a predefined small incidence angle range may reach a conductive detection surface, thereby allowing efficient control of the ion beam parallelism by maximizing the beam current through the high aspect ratio openings. Moreover, if the array of openings is provided with individual beam current measurement points, spatially resolved intensity measurements may be performed that allow estimation of the beam shape. Thus, a movable Faraday cup assembly may be replaced with the stationary array of high aspect ratio openings, thereby improving tool reliability.

19 Claims, 4 Drawing Sheets

ADVANCED ION BEAM MEASUREMENT TOOL FOR AN ION IMPLANTATION APPARATUS

BACKGROUND OF THE INVENTION

1. Field Of The Invention

The present invention generally relates to the fabrication of microstructures, such as integrated circuits, and, more particularly, to the operation of ion implantation tools required for producing well-defined doped regions in specified material regions, such as semiconductive regions.

2. Description of the Related Art

The fabrication of complex microstructures, such as sophisticated integrated circuits, requires that a large number of individual process steps be performed to finally obtain the required functionality of the microstructure. Especially in the formation of integrated circuits, the conductivity of specific areas has to be adapted to design requirements. For instance, the conductivity of a semiconductor region may be increased in a well-defined manner by introducing specific impurities, which are also referred to as dopants, and placing some, or preferably all, of these impurities at lattice sites of the semiconductor crystal. In this way, so-called PN junctions may be formed that are essential for obtaining a transistor function, since transistors represent the active elements, i.e., elements providing current or voltage amplification, which are required for manufacturing electronic circuits. In modern integrated circuits, millions of transistor elements, such as field effect transistors, are typically provided on a single die, wherein, in turn, a plurality of dies are provided on a single substrate. As the critical dimensions of certain circuit elements, such as field effect transistors, have now reached 0.1 $\mu$m and even less, it is of great importance to correspondingly "fine-tune" the profile of doped regions in the lateral direction, with respect to a substrate, as well as in the depth direction. Commonly, ion implantation is the preferred method for introducing dopants into specified device regions due to the ability to precisely control the number of implanted dopant atoms into substrates with a repeatability and uniformity of better than ±1%. Moreover, impurities that are introduced by ion implantation have a significantly lower lateral distribution when compared to conventional dopant diffusion processes. Since ion implantation is typically a room temperature process, the lateral profiling of a doped region may in many cases conveniently be achieved by providing a correspondingly patterned photoresist mask layer. These characteristics may render ion implantation currently, and in the near future, the preferred technique to produce doped regions in a semiconductor device.

Implantation of dopants is accomplished by various ion implantation tools. Such tools are extremely complex machines that require continuous monitoring of the machine characteristics so as to achieve high efficiency and machine utilization.

With reference to FIG. 1, a schematic overview is given for a typical ion implantation tool and the operation thereof. In FIG. 1, an ion implantation tool 100 comprises an ion source 101 having an input 102 that is connected to respective precursor sources (not shown) from which an appropriate ion species may be created in the ion source 101. The ion source 101 may be configured to establish a plasma atmosphere and to pre-accelerate charged particles into a beam pipe schematically depicted as 103. Downstream of the ion source 101, an accelerator tube 104 is arranged that is dimensioned to accelerate ions with a specified voltage, which may typically range from zero to approximately 200 keV for a typical medium current implanter and may range to several hundred keVs or even to 1 MeV or more in high energy implanters. Next, a beam shaping element 105 such as a quadrupole magnet may be arranged, followed by a deflector magnet 106. Downstream of the deflector magnet 106 is disposed an analyzing aperture, for instance in the form of a slit 107, the dimensions of which substantially determine an energy spread of the ion beam. Thereafter, a further beam shaping element, such as a quadrupole magnetic 108, may be provided downstream of the analyzing slit 107.

A substrate holder 109 is located at the vicinity of the end of the beam line 103, wherein, typically, the substrate holder 109 may be provided in the form of a plate enabling the receipt of one or more substrates 110, wherein the plate 109 is connected to a drive assembly (not shown) that allows moving of the substrate holder 109 in the transverse direction (as indicated by the arrows depicted in FIG. 1) and also allows control of the tilt angle, at least in two planes, at which the ion beam hits the substrate 110. For convenience, corresponding means for controlling and adjusting the tilt angle are not shown. Moreover, a first ion beam detector 111 may be provided, for instance, embodied by a plurality of Faraday cups that are connected with respective current measurement devices. Furthermore, a second ion beam detector 112 may be provided as a so-called traveling Faraday cup that is laterally movable to determine the shape of an ion beam and/or to shade respective Faraday cups during the measurement of specific beam characteristics, such as the angle of incidence. A corresponding arrangement of ion beam detectors 111 and 112 is, for example, realized in an ion implanter VIIsta80®, available from Varian Inc. It should be noted, however, that a plurality of other ion beam detector arrangements are available in other presently available ion implantation tools. A Faraday cup is typically constructed as a conductive container, the interior of which maintains devoid of an electric field when the cup is hit by charged particles. Ibis characteristic enables the detection of an ion beam substantially without influencing the ion beam when moving in the interior of the cup. Typically, a Faraday cup for implantation tools is made of graphite.

During the operation of the ion implantation tool 100, an appropriate precursor gas is supplied by the inlet 102 to the ion source 101 and ions of atoms included in the precursor gas may be accelerated into the beam line 103. Typically, a plurality of different ions having different charge states may be supplied by the ion source 101 and may thus be introduced into the acceleration tube 104. Typically, a preselection of the type of ions as well as of the respective charge states may be performed within the ion source 101 by a corresponding deflector magnet (not shown). Thereafter, the ions pass the accelerator tube 104 and gain speed in accordance with the applied acceleration voltage, the charge states of the respective ion and its corresponding mass. With the quadrupole magnet 105, the ion beam may be focused in one dimension and may be correspondingly defocused in the perpendicular dimension and the correspondingly shaped beam is directed to the deflector magnet 106. The current generating the magnetic field of the deflector magnet 106 is controlled so as to deflect the trajectory of desired ion species having a desired charge state to the opening of the analyzing slit 107. Ions of differing mass and/or charge state will typically hit the analyzer 107 without passing through the slit. Thus, the ions in the beam passing the analyzer 107 have a well-defined mass and an energy distribution defined by the slit size. It should be noted that in some ion implantation tools the deflecting magnet 106 and the analyzer 107 are configured such that the ion beam passing through the analyzer 107 may be scanned in a transverse direction so as to cover the whole area of a substrate or at least a significant portion thereof, since the dimension of the beam shape, i.e., the size of the beam spot, is usually, depending on the energy of the ion beam, significantly less than the area of a substrate to be processed. Next, the beam passing through the analyzer 107 may be further shaped by the quadrupole magnet 108 so that, in combination with the quadruple magnet 105, a desired beam shape may be obtained. The characteristics of the ion beam, i.e., the beam shape, the angle of incidence onto the substrate holder 109 and the internal parallelism, i.e., the beam divergence, and the like, may be measured prior to actually exposing the substrate 110 to the ion beam. To this end, the substrate holder 109 may be removed from the ion beam and the first and/or the second beam detector 111 and 112 may be operated so as to obtain the required measurement results. For instance, the traveling Faraday cup 112 may be positioned at different transverse locations and the corresponding dosage received at each transverse position may be determined so as to estimate and adjust the beam uniformity. Moreover, the Faraday cup 112 may be positioned so as to subsequently shade corresponding Faraday cups of the first ion detector 111, the measurement readings of which may then be used to estimate the main beam incidence angle and the beam divergence. Since both an incorrect angle of incidence and an insufficiently parallel ion beam, i.e., a non-vanishing beam divergence, may compromise a corresponding lateral dopant profile on the substrate 110, it is extremely important to precisely monitor and control the tilt angle and the beam divergence.

It turns out, however, that any change of an implantation parameter, for example the change of any bias voltages of apertures, minor changes of the settings of the beam shaping elements 105 and 108 and the like, require a thorough check of the beam profile and/or of the parallelism and tilt angle, which may necessitate a scan with the traveling Faraday cup, rendering the readjustment procedure extremely time consuming so that production yield and tool utilization is reduced.

In view of the above-identified problems, there exists a need for an improved technique that allows improvement of efficiency and/or accuracy of ion beam monitoring in an implantation tool.

SUMMARY OF THE INVENTION

Generally, the present invention is directed to various systems and methods that allow selection of a predefined angular range of an incident ion beam by providing a plurality of high aspect ratio openings through which portions of the ion beam are directed to at least one beam current sensitive surface. On the basis of the charge arriving at the beam current sensitive surface, the angular distribution within the ion beam may be estimated and, if desired, a control of the ion beam may be performed to improve the angular characteristics of the ion beam.

According to one illustrative embodiment of the present invention, a Faraday system comprises a body having an entrance surface exposable to an ion beam and a depth. A plurality of openings are formed in the entrance surface and extend along the depth. Moreover, at least one conductive detection region is disposed adjacent to the body so that at least a portion of the conductive detection region is aligned with at least one of the openings to receive ions through the opening.

According to still another illustrative embodiment of the present invention, a Faraday system comprises a movable Faraday cup designed to allow ion beam profile measurements. The system further comprises a Faraday assembly attached to the movable Faraday cup, wherein the Faraday assembly includes a body having an entrance surface and a plurality of openings formed in the entrance surface and extending through the body. Furthermore, one or more conductive detection regions are associated with one ore more of the openings to receive ion beam portions through the openings.

According to yet a further illustrative embodiment of the present invention, a method of controlling an ion beam is provided. The method comprises exposing at least one detection surface to an ion beam through a plurality of longitudinal openings that are substantially devoid of an electric field. Additionally, at least one of beam parallelism and beam divergence is adjusted on the basis of a measurement reading from the detection surface.

According to another illustrative embodiment of the present invention, a method of monitoring an ion beam comprises scanning a Faraday system across an ion beam for a plurality of scan positions, and determining a beam intensity of at least some sub-portions of a beam portion impinging on the Faraday system at each scan position.

BRIEF DESCRIPTION OF THE DRAWINGS

The invention may be understood by reference to the following description taken in conjunction with the accompanying drawings, in which like reference numerals identify like elements, and in which.

Figure 1:
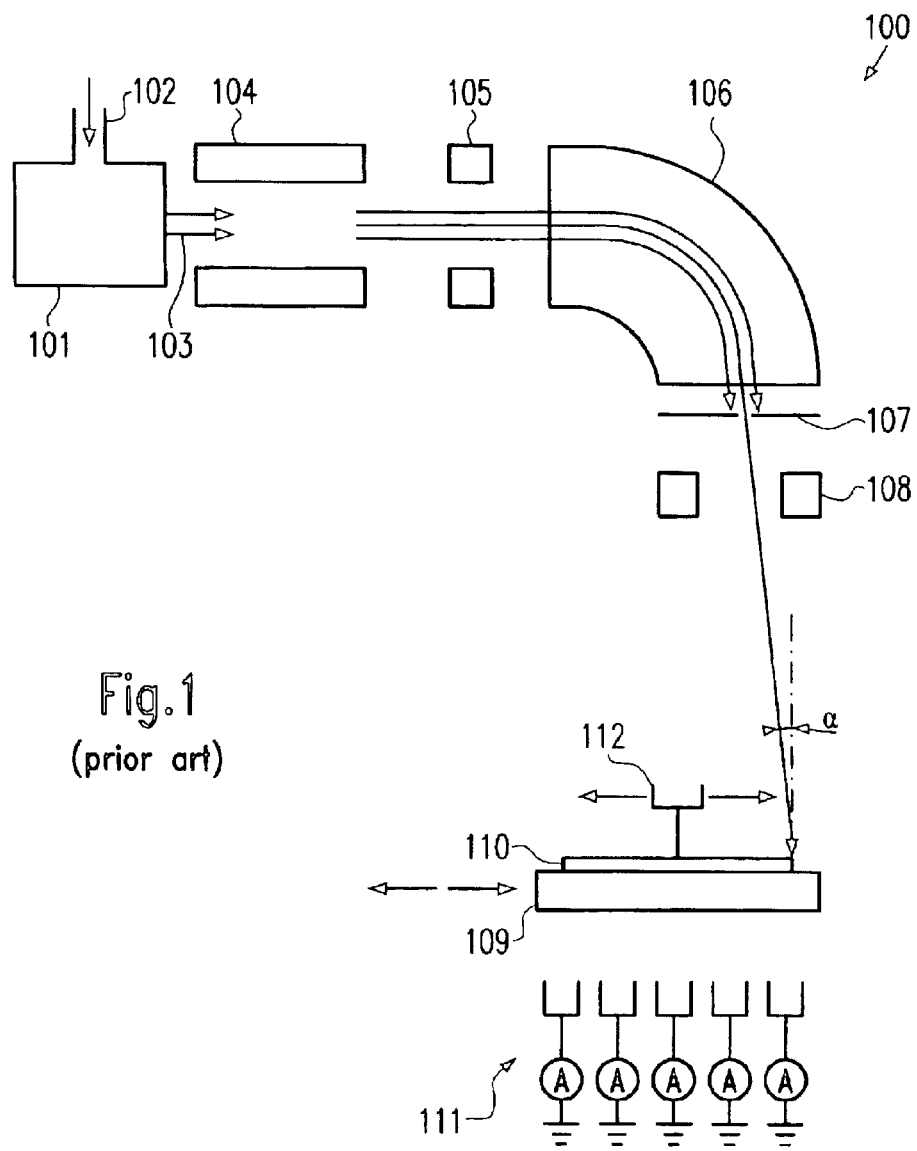
FIG. 1 schematically illustrates an ion implantation tool with a conventional beam detection system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept of providing a plurality of Faraday cups having a high aspect ratio, i.e., a high ratio of depth to diameter, so as to provide an enhanced sensitivity to highly parallel ions, wherein a large portion of the incident ion beam or even the complete ion beam may be monitored simultaneously.

Figure 2A:
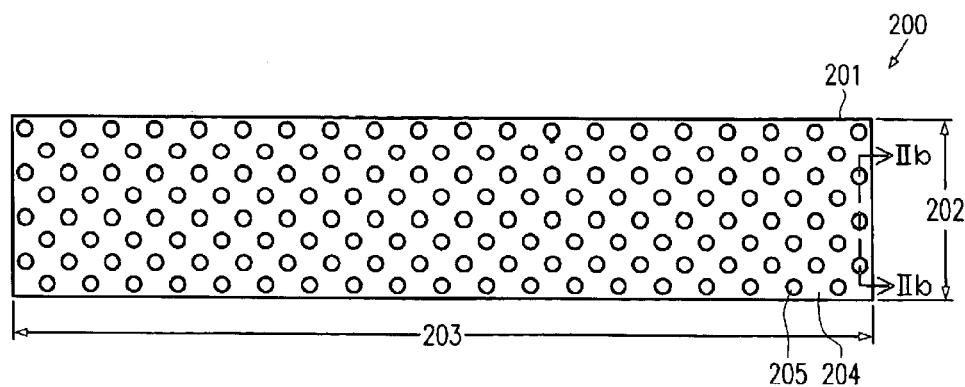
FIGS. 2a–2d schematically show a plan view and sectional views, respectively, of a Faraday system having an enhanced sensitivity to beam misalignment in accordance with illustrative embodiments of the present invention.

With reference to FIGS. 2a–2c and 3, further illustrative embodiments of the present invention will now be described. FIG. 2a schematically shows a Faraday system 200 that comprises a block or plate 201 formed of a conductive material. In one particular embodiment, the plate 201 may substantially be comprised of graphite, which shows an acceptable rate of out-diffusion under vacuum conditions upon bombardment with energetic ions. However, other conductive materials considered suitable for employment with a specified ion species within a specified energy range may be used for the plate 201. The plate 201 has a height 202 and a length 203, which are selected in accordance with process and tool specifics. For instance, the height 202 is selected such that an extension of an ion beam for a predefined energy range is less than the height 202. Moreover, the length 203, which is assumed to be the direction of a possible scan motion of the ion beam during the operation of the respective ion implantation tool, is selected such that at least the corresponding size of a substrate to be processed and the maximum usable deflection angle of the ion beam is covered by the length 203. A typical measure for the height 202 may be approximately 100 mm and more, as some of the presently available ion implantation tools, such as the tool shown in FIG. 1, have a beam size in the height direction of approximately 100 mm and less. The length 203 for processing a 300 mm substrate may be selected greater than 300 mm, for instance approximately 350 mm. Similarly, when 200 mm substrates are processed, the length 203 may be selected to be more than 200 mm, for instance approximately 250 mm.

The plate 201 further comprises an entrance surface 204 having formed therein a plurality of openings 205 that may be provided as bores that extend through the plate 201. The number and the diameter of the openings 205 may be selected such that a desired sensitivity to a predefined range of incidence angles and/or beam divergence is obtained. Without limiting the present invention, a diameter of the openings 205 may range from a few mm to some 10 mm. The number of openings 205 within the entrance surface 204 depends on the area of the entrance surface 204 and may range from a few openings to 40 or even more openings. Corresponding criteria will be discussed with reference to FIG. 2b. In one particular embodiment, the openings 205 are arranged in a substantially regular array, which will allow accurate beam current measurements as will be discussed later on.

Figure 2B:
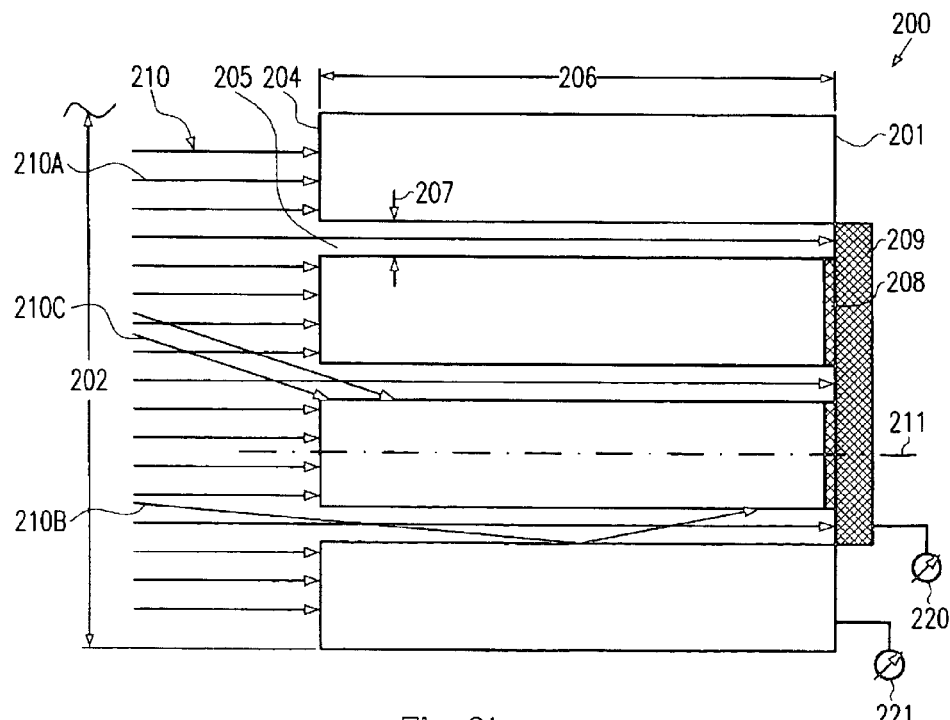

FIG. 2b schematically shows a cross-sectional view of the Faraday system 200 along the section IIB of FIG. 2a. As shown, the openings 205 exhibit a depth 206, which may be defined in the present example by the depth of the plate 201. The depth 206 may range from approximately 30 mm to several hundred mm, depending on the desired aspect ratio of the openings 205 and the beam energy range. Moreover, an electrically conductive region 209 is positioned and aligned with at least some of the openings 205 to receive ions through the openings 205 as will be discussed later on. The conductive region 209 may be electrically insulated from the plate 201 by respective isolation regions 208. As previously explained with reference to the plate 201, the conductive region 209 may be comprised of any material deemed appropriate for receiving highly energetic ions under high-vacuum conditions, such as graphite. The isolation regions 208 may be comprised of any appropriate material. The isolation regions 208 may optionally comprise respective connectors so as to allow drain-off of any additional charges that may be accumulated during an ion bombardment. For convenience, a corresponding optional connector is not shown in FIG. 2b.

During operation of the Faraday system 200, a conventional Faraday system, such as the system 111 shown in FIG. 1, may be replaced by the Faraday system 200. Moreover, as will be explained, the Faraday system 200 may be used to determine both the beam angle characteristics, i.e., the angle of incidence and/or the beam divergence, and beam shape. Consequently, the traveling Faraday cup, frequently installed in conventional implantation tools, may be omitted. The replacement of the traveling Faraday cup may provide for better maintainability and faster and more accurate tuning of the beam characteristics. Additionally, the operation of the traveling Faraday cup may result in a great chance of deteriorating the vacuum condition within the process chamber, since any moving parts may give rise to vacuum burst and/or potential vacuum leaks.

During the set up of an appropriate ion beam 210, for instance created by an implantation tool as shown in FIG. 1, the beam characteristics, such as the angle of incidence, the beam shape, and the like, have to be thoroughly monitored and controlled so as to conform with requirements of sophisticated process technologies. For instance, the ion beam 210 may comprise a substantially parallel portion 210A and divergent portions 210B and 210C having, respectively, a small angle of incidence and a moderate angle of incidence with respect to an axis 211 along the depth direction. The diameter 207 of the openings 205 may be selected so that ions hitting the Faraday system 200 with an angle of incidence equal to or greater than the portion 210C will be absorbed by the plate 201. Moreover, the depth 206 and, thus, the effective aspect ratio of the openings 205 may be selected sufficiently high so that ions moving along trajectories as represented by the portion 210B may be absorbed with a high probability within the openings 205, even if the corresponding ions are one or more times deflected by the sidewalls of the openings 205. In one embodiment, the depth 206 and the diameter 207 are selected so as to obtain an aspect ratio of approximately three to five. In other embodiments, the aspect ratio is five or greater. Ions of the substantially parallel portion 210A entering the openings 205 are substantially completely absorbed by the conductive region 209, thereby creating a corresponding signal in a measurement device 220 connected with the conductive region 209. Similarly, the plate 201 may be connected to a measurement device 221 that allows determination of the charge deposited on the plate 201. For optimizing the parallelism of the ion beam 210, one or more tool parameters may be controlled such that the measurement reading obtained from the conductive region 209 is increased. Advantageously, the parameter setting is selected such that a maximum measurement reading is provided from the conductive region 209, indicating that a maximum amount of ions actually arrives at the conductive region 209. In order to substantially eliminate measurement inaccuracies caused by possible beam current fluctuations, the integrated measurement readings of the plate 201 and the conductive region 209 may be determined and may be used as a calibration value. Thus, by observing the measurement readings of the conductive region 209, an accurate and fast method is provided to optimize the angle of incidence of the ion beam 210 irrespective of possible beam current fluctuations.

Figure 2C:
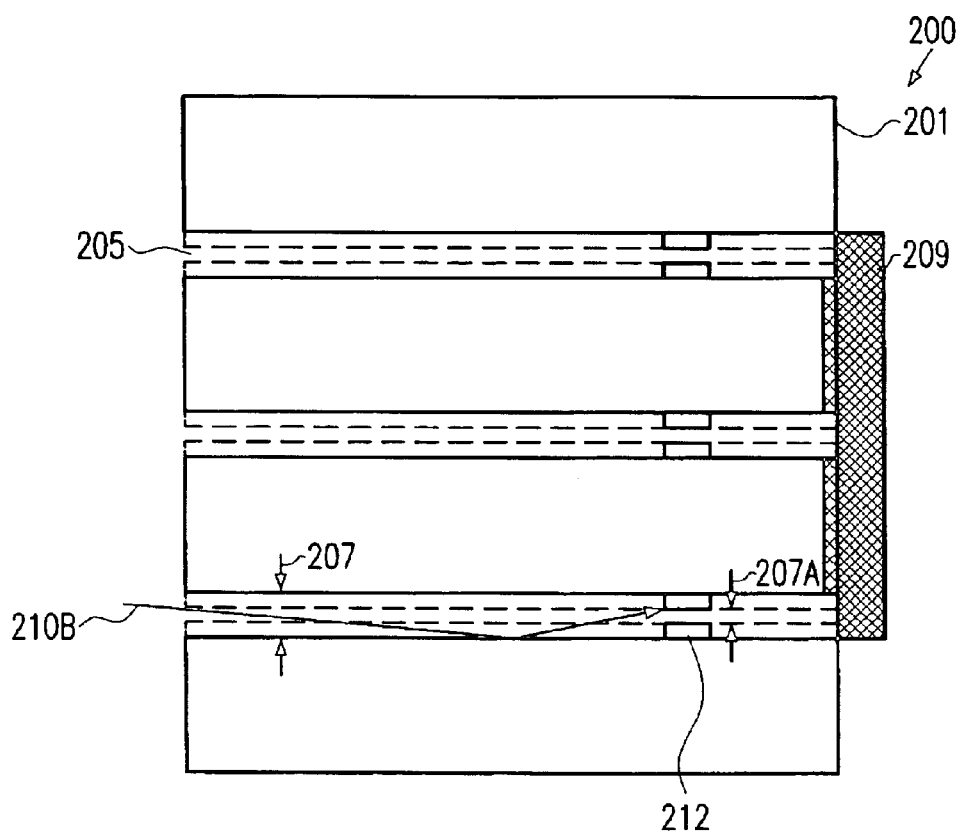

FIG. 2c shows a further illustrative variation of the Faraday system 200, wherein restricting apertures 212 are provided within the openings 205 that may further limit the range of incidence angles that contribute to the measurement reading of the conductive region 209. Alternatively, the openings 205 may be completely formed with the effective diameter 207A so as to substantially prevent the ion beam portion 210B from reaching the conductive region 209. Whereas the latter variant assures a simple manufacturing process, providing the restricting apertures 212 at the rear portion of the openings 205 may allow the rejection of ions that are one or more times deflected by the sidewalls of the opening 205 at a relatively small angle. Thus, the restricting aperture 212 may also be considered as anti-glance apertures. The provision of the anti-glance apertures 212 further enhances the accuracy in determining an optimum beam parallelism on the basis of the measurement readings of the conductive region 209.

Figure 2D:
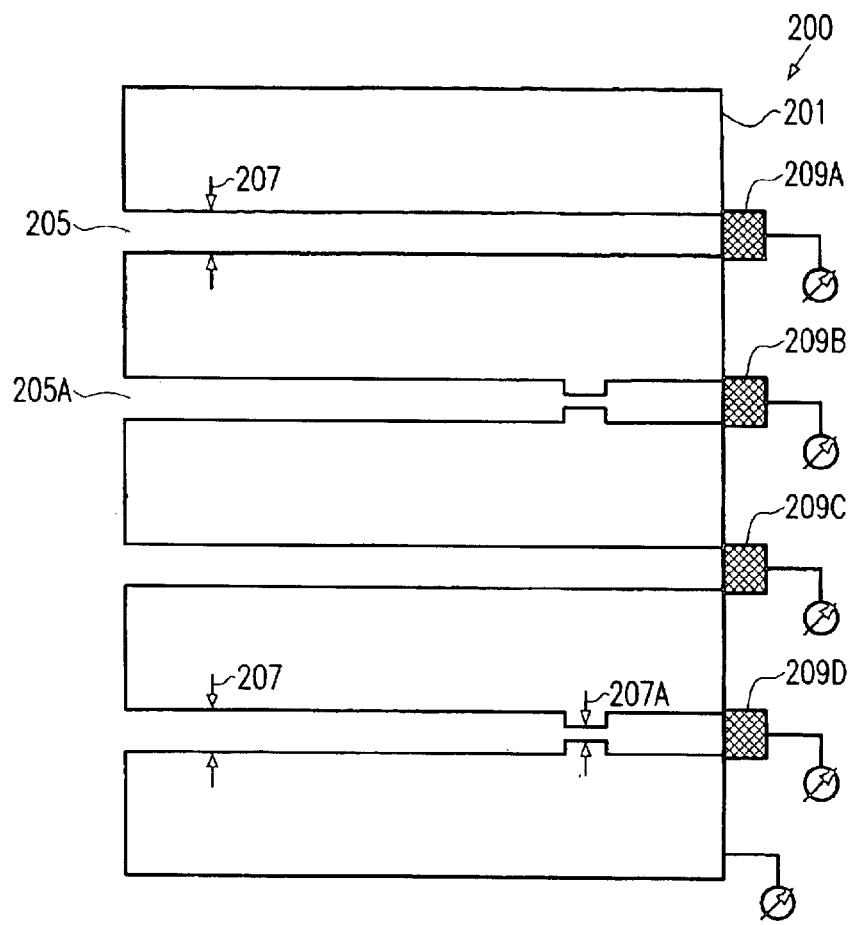

With reference to FIG. 2d, further illustrative embodiments are now described. As shown, the Faraday system 200 comprises a plurality of conductive regions 209A, . . . , 209D, each of which may be assigned to one or more openings 205. In one particular embodiment, as illustrated in FIG. 2d, each of the plurality of conductive regions 209A, . . . , 209D is assigned to a single opening 205. By providing a plurality of conductive regions, the spatial distribution of the ion beam 210 may be determined, wherein the accuracy of the spatial resolution depends on the number of openings 205 assigned to each of the conductive regions 209A, . . . , 209D. When adjusting the beam characteristics by using the Faraday system 200 as shown in FIG. 2d, the beam parallelism may be optimized in the manner as described above in that the measurement readings of all conductive regions 209A, . . . , 209D are added together and those parameter settings are selected resulting in an increased or maximum total beam current. As previously noted, the total beam current detected by the plate 201 and the plurality of conductive regions 209A, . . . , 209D may be used as a weighting factor that ensures independence of the parallelism control from beam current fluctuations. Moreover, a portion of the measurement readings or all of the measurement readings of the conductive regions 209A, . . . , 209D may be used to determine a two-dimensional or three-dimensional picture of the ion beam, depending on the manner of reading out the beam current values. For instance, the matrix formed by the plurality of conductive regions 209A, . . . , 209D may be read out fast enough, e.g., within a few microseconds to a few milliseconds for each of the conductive regions 209A, . . . , 209D, to provide a three-dimensional picture, i.e., spatial distribution plus current intensity, of the ion beam. To this end, the matrix of the conductive regions 209A, . . . , 209D may be displayed correspondingly, wherein, for instance, the presently determined beam current of each conductive region is represented by a specific color. It should be appreciated, however, that the corresponding measurement readings may additionally or alternatively be provided to a corresponding control unit which may perform a data processing so as to appropriately present the beam current data and/or to appropriately control one or more implantation tool parameters on the basis of this measurement data.

In a further illustrative embodiment, as shown in FIG. 2d, some of the openings 205 may comprise an anti-glance aperture 212 defining an effective diameter 207A or may comprise a diameter 207A along the entire depth of the openings. Respective openings having an anti-glance aperture 212 or having a reduced diameter 207A are indicated by 205A. For a perfectly parallel incident ion beam, the ratio of the beam currents detected in an opening 205 having the diameter 207 and an opening 205A having the effective diameter 207A is equal to the square of the ratio of the diameters 207 and 207A. Thus, the portion of the ion beam that is not perfectly parallel, i.e., perfectly in the sense of a reduced angle deviation determined by the small diameter 207A, may be determined, since the diameters 207 and 207A are well defined and the corresponding beam currents may be measured by the respective conductive regions 209A, . . . , 209D. Moreover, the ratios of beam currents obtained by openings 205 should be identical to the ratio of beam currents obtained from openings 205A for a substantially uniform ion beam in the area containing the respective openings 205, 205A. Thus, a beam non-uniformity within this area may be detected, thereby providing additional information on the validity of the beam parallelism measurement. The corresponding calculations may be performed automatically and the results may be used, for instance by an operator or by a corresponding control unit, to efficiently determine optimum parameter settings. Since the plurality of conductive regions 209A, . . . , 209D are arranged in a matrix form, the beam characteristics in each transverse direction may be monitored and controlled. That is, an angle distribution of the ion beam in a plane perpendicular to the drawing plane may also be determined.

Figure 3:
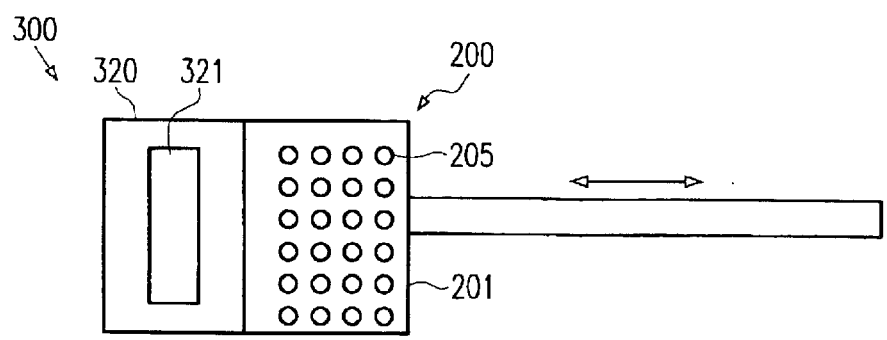
FIG. 3 schematically illustrates a plan view of a combination of a conventional traveling Faraday cup and a beam current detector in accordance with further illustrative embodiments of the present invention.

FIG. 3 schematically depicts another Faraday system 300 according to further illustrative embodiments of the present invention. As previously explained with reference to FIG. 1, some currently available implantation tools may be equipped with a traveling Faraday cup so as to shade sequentially a plurality of further Faraday cups positioned down-stream of the traveling Faraday cup. Moreover, the traveling Faraday cup may be used in determining the beam shape by scanning through the beam and measuring the corresponding beam current. In the Faraday system 300, a conventional traveling Faraday cup 320 may be provided and may be combined with a Faraday cup, as similarly described with reference to FIGS. 2a–2d, which is indicated as Faraday cup 200 that allows fast and efficient control of the beam parallelism. In a further embodiment (not shown), the conventional traveling Faraday cup 320 may be completely replaced by the Faraday cup 200, wherein the Faraday cup 200 may be movable in the transverse direction as the previously provided traveling Faraday cup. The integrated beam current obtained by the body 201 and gathered by the conductive regions terminating the openings 205 may be used as beam current information for determining the beam profile, wherein some or all of the measurement readings obtained from the individual openings 205 may be used in estimating the parallelism of the ion beam, as is discussed above.

Again referring to FIG. 3, the traveling Faraday cup 320 comprising a defined entrance opening 321 is moved simultaneously with the additional Faraday cup, wherein the Faraday cup 320 may be used for beam profile measurements while the Faraday cup 200 provides for the required information on the beam parallelism. When scanning the system 300 in the transverse direction, the spatial offset between the conventional Faraday cup 320 and the Faraday cup 200 may be accounted for so that the beam characteristics of a beam portion detected by the Faraday cup 320 may be associated with the corresponding measurement results of the Faraday cup 200, obtained at substantially the same position. In this manner, the beam profile may be monitored and simultaneously, the beam parallelism or beam divergence may be monitored and controlled in a very fast and efficient manner. Since the matrix arrangement of the openings 205 allows the generation of a three-dimensional picture of the ion beam, an efficient means is provided so as to observe the results of a parameter change in a substantially continuous manner.

As a result, an array of a high aspect openings enables a fast and accurate measurement of incidence angle deviation and/or beam divergence. The high aspect ratio assures that only ions of a predefined small incidence angle range may reach a conductive detection surface, thereby allowing efficient control of the ion beam parallelism by maximizing the beam current through the high aspect ratio openings. Moreover, if the array of openings is provided with individual beam current measurement points, spatially resolved intensity measurements may be performed that allow estimation of the beam shape. Thus, a movable Faraday cup assembly may be replaced with the stationary array of high aspect ratio openings, thereby improving tool reliability. Moreover, a conventional movable Faraday cup may be combined with a Faraday system of the present invention to enhance control accuracy and control efficiency.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A Faraday system, comprising:
    a body having an entrance surface exposable to an ion beam and a depth;
    a plurality of openings formed in said entrance surface and extending along said depth; and
    at least one conductive detection region disposed adjacent to said body so that at least a portion of said conductive detection region is aligned with at least one of said openings to receive ions through said at least one opening.

2. The Faraday system of claim 1, wherein said body comprises a conductive material.

3. The Faraday system of claim 1, wherein a length of said entrance surface is selected so as to exceed a diameter of a substrate to be exposed to said ion beam with a maximum deflection angle of said ion beam.

4. The Faraday system of claim 1, wherein a height of said entrance surface is selected so as to exceed a beam extension along the height direction when said ion beam has an energy within a predefined range.

5. The Faraday system of claim 1, wherein an aspect ratio of said openings is approximately three or greater.

6. The Faraday system of claim 5, wherein said aspect ratio is at least five.

7. The Faraday system of claim 1, wherein a cross-sectional area of at least one of said openings varies along said depth.

8. The Faraday system of claim 1, wherein a cross-sectional area of at least one of said openings differs from a cross-sectional area of another one of said openings.

9. The Faraday system of claim 1, wherein said detection region comprises plural conductive detection sub-regions that are electrically insulated from each other, each of said sub-regions disposed adjacent one or more dedicated openings to receive an ion beam portion through said one or more dedicated openings.

10. The Faraday system of claim 9, wherein some of the plural sub-regions have, at least at one location along said depth, a cross-sectional area that is less than a cross-sectional area of at least one other sub-region.

11. The Faraday system of claim 1, further comprising a charge-sensitive measurement device connected to said detection region.

12. The Faraday system of claim 9, further comprising a charge-sensitive measurement device connected to said plural detection sub-regions to provide individual measurement readings for each of said sub-regions.

13. The Faraday system of claim 1, further comprising a Faraday cup designed for beam shape measurement, said Faraday cup being attached to said body.

14. The Faraday system of claim 1, further comprising a drive assembly coupled to said body to move said body at least transversely to said ion beam.

15. A Faraday system, comprising:
    a traveling Faraday cup designed to allow ion beam profile measurements; and
    a Faraday assembly attached to said traveling Faraday cup, said Faraday assembly including:
        a body having an entrance surface and a plurality of openings formed in said entrance surface and extending through said body, and
        one or more conductive detection regions associated with one ore more of said openings to receive ion beam portions through said openings.

16. A method of controlling an ion beam, the method comprising:
    exposing at least one detection surface to an ion beam through a plurality of longitudinal openings that are substantially devoid of an electric field; and
    adjusting at least one of beam parallelism and beam divergence on the basis of a measurement reading from said at least one detection surface.

17. The method of claim 16, wherein adjusting at least one of beam parallelism and beam divergence further comprises varying at least one tool parameter and selecting a parameter value as a desired value when a maximum beam current is detected.

18. A method of monitoring an ion beam, the method comprising; scanning a Faraday system across an ion beam for a plurality of scan positions; the said Faraday system comprising
   a body having an entrance surface and a plurality of opening formed in said entrance surface and extending through said body, and one or more conductive detection regions associated with one or more of said openings to receive ion beam portions through said openings, and determining a beam intensity of at least some sub-portions of a beam portion impinging on said Faraday at each scan position.

19. The method of claim 18, further comprising comparing the beam intensity of at least two sub-portions of the impinging ion beam portion, and estimating at least one of a beam parallelism and a beam divergence on the basis of a result of said comparison.

* * * * *